(12) United States Patent
Akimitsu et al.

(10) Patent No.: US 7,445,681 B2
(45) Date of Patent: Nov. 4, 2008

(54) INTERMETALLIC COMPOUND SUPERCONDUCTING MATERIAL COMPRISING MAGNESIUM AND BERYLLIUM AND ALLOY SUPERCONDUCTING MATERIAL CONTAINING THE INTERMETALLIC COMPOUND

(75) Inventors: Jun Akimitsu, Tokyo (JP); Yuji Zenitani, Tokyo (JP); Takahiro Muranaka, Tokyo (JP); Kazunobu Kadomura, Tokyo (JP)

(73) Assignee: Japan Science and Technology Agency, Kawaguchi-shi (JP)

( * ) Notice: Subject to any disclaimer, the term of this patent is extended or adjusted under 35 U.S.C. 154(b) by 544 days.

(21) Appl. No.: 10/469,245

(22) PCT Filed: Mar. 8, 2002

(86) PCT No.: PCT/JP02/02205

§ 371 (c)(1),
(2), (4) Date: Sep. 8, 2003

(87) PCT Pub. No.: WO02/072903

PCT Pub. Date: Sep. 19, 2002

(65) Prior Publication Data

US 2004/0094233 A1     May 20, 2004

(30) Foreign Application Priority Data

Mar. 9, 2001     (JP) .............................. 2001-067663

(51) Int. Cl.
*C22C 23/00* (2006.01)

(52) U.S. Cl. ...................... 148/420; 148/442; 420/402; 420/580; 420/901; 505/100; 505/785; 505/805

(58) Field of Classification Search ................ 148/420, 148/442; 420/402–414, 580, 901; 505/100, 505/785, 805
See application file for complete search history.

(56) References Cited

FOREIGN PATENT DOCUMENTS

| | | |
|---|---|---|
| JP | 45-39325 | 12/1970 |
| JP | 63236794 | * 10/1988 |

(Continued)

OTHER PUBLICATIONS

I. Felner; "Absence of Superconductivity in BeB$_2$"; Racah Institute of Physics; Feb. 28, 2001. Cited in the int'l. search report.

(Continued)

*Primary Examiner*—Sikyin Ip
(74) *Attorney, Agent, or Firm*—Western, Hattori, Daniels & Adrian, LLP.

(57) ABSTRACT

There are provided an intermetallic-compound superconductor that is high in superconducting transition temperature, and an alloy superconductor that is high in superconducting transition temperature and excels in malleability and ductility, as well as a method of making such a superconductor with good reproducibility and at a low cost of manufacture. This entirely new intermetallic compound superconductor is made of magnesium (Mg) and beryllium (Be) and has a chemical composition expressed by formula: $Mg_1Be_2$, has a hexagonal $AlB_2$ type crystallographic structure and has a superconducting transition temperature ($T_c$) of 35 K. An alloy containing this intermetallic compound excels in malleability and ductility and constitutes the alloy superconductor having a superconducting transition temperature ($T_c$) of 35 K and being low in specific resistance for normal conduction at a temperature ranging from the superconducting transition temperature to a room temperature. In the method of manufacture, a Mg containing feedstock powder and a Be containing feedstock powder are mixed together to form a mixture thereof which is, e.g., hot pressed to produce a semiconductor product.

3 Claims, 3 Drawing Sheets

FOREIGN PATENT DOCUMENTS

JP  4-297542  10/1992
WO  WO 95/20059  7/1995

OTHER PUBLICATIONS

Jun Nagamatsu et al.; Letters to Nature, vol. 410, pp. 63-65, Mar. 1, 2001. Cited in the int'l. search report.

I. Felner; Physica C, vol. 353, No. 1, pp. 11-13, 2001. Cited in the int'l. search report.

M. J. Mehl et al.; Physical Review B.; vol. 64, pp. 1040509-1 to 1040509-4. 2002. Cited in the int'l. search report.

* cited by examiner

INTERMETALLIC COMPOUND SUPERCONDUCTING MATERIAL COMPRISING MAGNESIUM AND BERYLLIUM AND ALLOY SUPERCONDUCTING MATERIAL CONTAINING THE INTERMETALLIC COMPOUND

TECHNICAL FIELD

This present invention relates to an intermetallic-compound superconductor and an alloy superconductor which can be utilized in superconducting electronics such as a large scale electric power transmission system, a superconductive power storage system, a high performance Josephson device and a high frequency electronic device, and which especially are high in superconducting transition temperature, are easy to manufacture, excel in malleability and ductility, and yet are altogether new. The invention also relates to a method of making such a novel superconductor.

BACKGROUND ART

Superconductors are known to include a superconductor made of a simple metal, a superconductor made of a compound, and a superconductor made of composite oxides.

A simple metal superconductor may contain a simple metal such as Pb and Nb but is known to lack utility because it is low in superconducting transition temperature.

Known as intermetallic compound superconductors include those having a Al5 type crystallographic structure of intermetallic compounds as represented by $Nb_3Ge$, $Nb_3Ga$, $Nb_3Al$ and $Nb_3Sn$, and those having a chevrel type crystallographic structure of intermetallic compounds as represented by $PbMo_6S_8$. Intermetallic compound superconductors having an $AlB_2$ type crystallographic structure of intermetallic compounds as represented by $NbB_2$ are also known which, however, are also known to be extremely low in superconducting transition temperature ($T_c$=0.62 K, see Journal of the Less-Common Metals, 67 (1979), 249-255). These intermetallic compound superconductors include one with $Nb_3Ge$ which is relatively high in superconducting transition temperature (=about 23 K), but commonly have the disadvantage that they are weak in distortion and are fragile.

Known as a composite oxide superconductor include La group oxide superconductors as represented by composition $La_{2-x}Ba_xCuO_4$, Y group oxide superconductors as represented by composition $Y_1Ba_2Cu_3O_{7-x}$, Bi group oxide superconductors as represented by composition $Bi_2Sr_2Ca_{n-1}Cu_nO_{2n+2}$, Tl group superconductors as represented by composition $Tl_2Ba_2Ca_{n-1}Cu_nO_{2n+2}$, and Hg group oxide superconductors as represented by $Hg_1Ba_1CaCu_1O_{6+x}$. These composite oxide superconductors are high in superconducting transition temperature and indeed include those which have their superconducting transition temperatures reaching as high as 150 K. The composite oxide superconductor has a perovskite structure made up of a lamination of an octahedral, pyramidal or planar superconducting layer of $CuO_2$, and a block layer (dissimilar in crystallographic structure to the superconducting layer) made of an atom or atoms such as La, Ca, Y, Bi or Hg and oxygen. As such the extreme complexity of the crystallographic structure of a composite oxide superconductor makes it difficult to conduct its production in a large volume and with good reproducibly. In addition, the superconductor being a composite oxide is naturally poor in both malleability and ductility, and is hard to use as a superconducting electric cable or wire.

A well known alloy superconductor is a Nb—Ti alloy, which is excellent in malleability and ductility and hence has been used to form superconducting electric cables or wires and superconducting magnets. However, an alloy conductor is as low in superconducting transition temperature as, e.g., about 9 K with the Nb—Ti alloy, and hence improvements in them are being sought.

As to superconducting cables or wires, it should also be noted that it may happen that a portion of a superconducting cable incidentally becomes normally conductive. Once this takes place, it may bring about a phenomenon, known as the "quenching" phenomenon, that triggered by Joule heating of the portion rendered normally conductive to have a finite electrical resistance, the entire material in a moment becomes normally conductive. When the quenching phenomenon occurs, serious consequences are met such as the burning of the superconducting cable and the explosive vaporization of coolant, both due to the Joule heat.

An attempt that has so far been made to avoid the quenching phenomenon is to provide a current bypass for a superconducting cable by winding a metal wire low in electric resistivity (specific resistance) around the superconducting cable so that when a portion of the superconducting cables incidentally becomes normally conductive, the current is allowed to escape through the current bypass.

The metal wire low in electric resistivity must, however, be formed of a metal such as silver (Ag) that is expensive and must therefore make the superconducting cable costly.

It is accordingly an object of the present invention to provide an alloy superconductor that is high in superconducting transition temperature and also excels in malleability and ductility, and that can be used to form a superconducting cable without the need for a current bypassing metal wire. It is further an object of the present invention to provide methods of making superconductors reproducibly and at a relative low cost of manufacture.

DISCLOSURE OF THE INVENTION

In order to attain the object first mentioned above there is provided in accordance with the present invention an alloy superconductor, characterized in that it is an alloy having a composition represented by composition formula: $MgBe_xB_y$, where $0<x<20$ and $0<y<20$.

The said alloy superconductor preferably has a superconducting transition temperature ($T_c$) of 35 K.

The said alloy superconductor preferably has a specific resistance not greater than $6 \times 10^{-5}$ ohm-cm at a temperature ranging from its superconducting transition temperature ($T_c$) of 35 K to a room temperature.

Also, the alloy superconductor made up as mentioned above has a superconducting transition temperature ($T_c$) of 35 K, and is higher in superconducting transition temperature than any alloy superconductor so far known and also excels in both malleability and ductility. Moreover, it is lower in specific resistance at a temperature ranging from the superconducting transition temperature to a room temperature than any alloy superconductor so far known.

Further, the alloy superconductor made up as mentioned above can be used as a superconductor high in superconducting transition temperature and also excellent in malleability and ductility for a superconducting electric wire or cable used in a superconducting electric power transmission system, a superconducting electric power storage system or the like and also in a superconducting electronic component such as a high performance Josephson device and a high frequency or electronic device.

A method of manufacture of an alloy superconductor in accordance with the present invention comprises the steps of: mixing a Mg containing feedstock powder, a Be containing feedstock powder and a B containing feedstock powder together to form a mixture powder thereof so that the mixture powder contains Mg, Be and B at a compositional ratio of Mg:Be:B=1:x:y where 0<x<20 and 0<y<20, shaping the said mixture powder into the form of a pellet, and heating the said pellet in a pressurized inert gas to form the alloy superconductor.

An alternative method of manufacture of an alloy superconductor in accordance with the present invention may comprise the steps of: mixing a Mg containing powder, a Be containing feedstock powder and a B containing feedstock powder together to form a mixture powder thereof so that the mixture powder contains Mg, Be and B at a compositional ratio of Mg:Be:B=1:x:y where 0<x<20 and 0<y<20, shaping the said mixture powder into the form of a pellet, and pressing and heating or hot pressing the said pellet to form the alloy superconductor.

In the method of manufacture of an alloy superconductor mentioned above, the said pellet is advantageously heated in the said inert gas under a pressure of 1 to 200 MPa at a temperature of 600 to 1100° C. for a period of several minutes or more.

In the method of manufacture of an alloy superconductor mentioned above, the said pellet is advantageously pressed and heated or hot pressed under a pressure of 0.1 to 6 GPa at a temperature of 700 to 1400° C. for a period of several minutes or more.

The methods mentioned above of making an alloy superconductor permit an alloy superconductor containing an intermetallic compound in accordance with the present invention to be manufactured reproducibly and easily.

BRIEF DESCRIPTION OF THE DRAWINGS

The present invention will better be understood from the following detailed description and the drawings attached hereto showing certain illustrative forms of embodiment of the present invention. In this connection, it should be noted that such forms of embodiment illustrated in the accompanying drawings hereof are intended in no way to limit the present invention but to facilitate an explanation and understanding thereof. In the drawings.

BEST MODES FOR CARRYING OUT THE INVENTION

Figure 1:
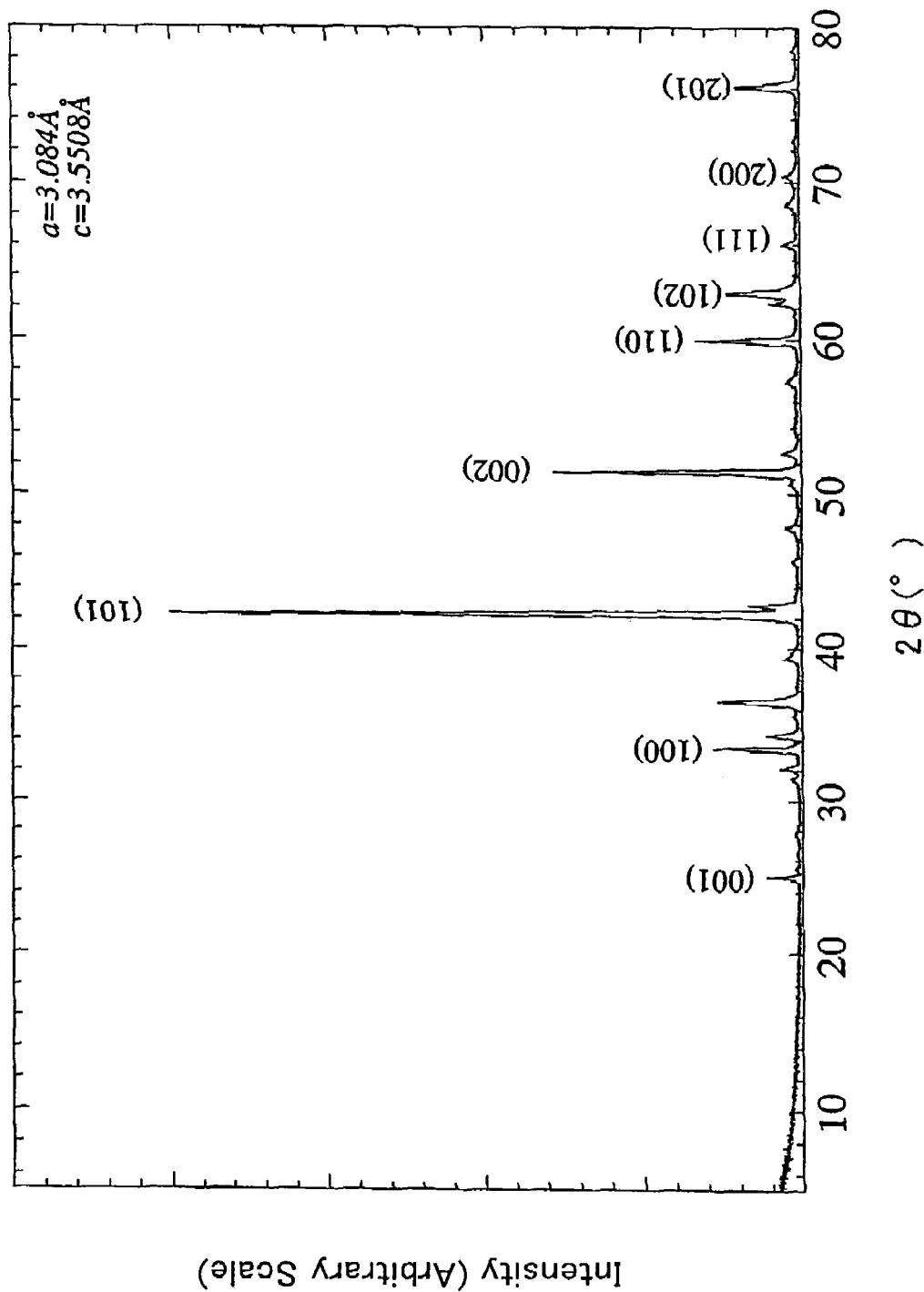
FIG. 1 is a diagram illustrating a result of powder X-ray diffraction measurements conducted of an alloy superconductor of a composition represented by composition formula: $Mg_1Be_xB_y$ (where 0<x<20 and 0<y<20) according to the present invention.

Hereinafter, the present invention will be described in detail with reference to suitable forms of implementation thereof illustrated in the drawing figures.

FIG. 1 is a diagram illustrating a result of powder X-ray diffraction measurements conducted of an alloy superconductor of a composition represented by composition formula: $Mg_1Be_xB_y$ (where 0<x<20 and 0<y<20) according to the present invention.

The X-ray diffraction measurements were conducted using a biaxial X-ray diffraction analyzer (made by company RIGAKU, model RINT2000).

From the powder X-ray diffraction measurement pattern shown in FIG. 1, it is seen that the alloy superconductor of the present invention has a crystallographic structure that is hexagonal and belongs to the space group p6/mmm. It is also seen that with its a-axis having a length of 3.084 angstroms and its c-axis having a length of 3.5508 angstroms, it is a hexagonal $AlB_2$ type crystallographic structure.

Also in identifying the chemical composition, use is made of EPMA (Electron Probe Micro Analysis) and ICP (Induced Coupled Plasma) methods.

Mention is next made of the superconducting characteristics of an alloy superconductor of an alloy superconductor of a composition represented by composition formula: $Mg_xBe_xB_y$ (where 0<x<20 and 0<y<20) according to the present invention.

Figure 2:
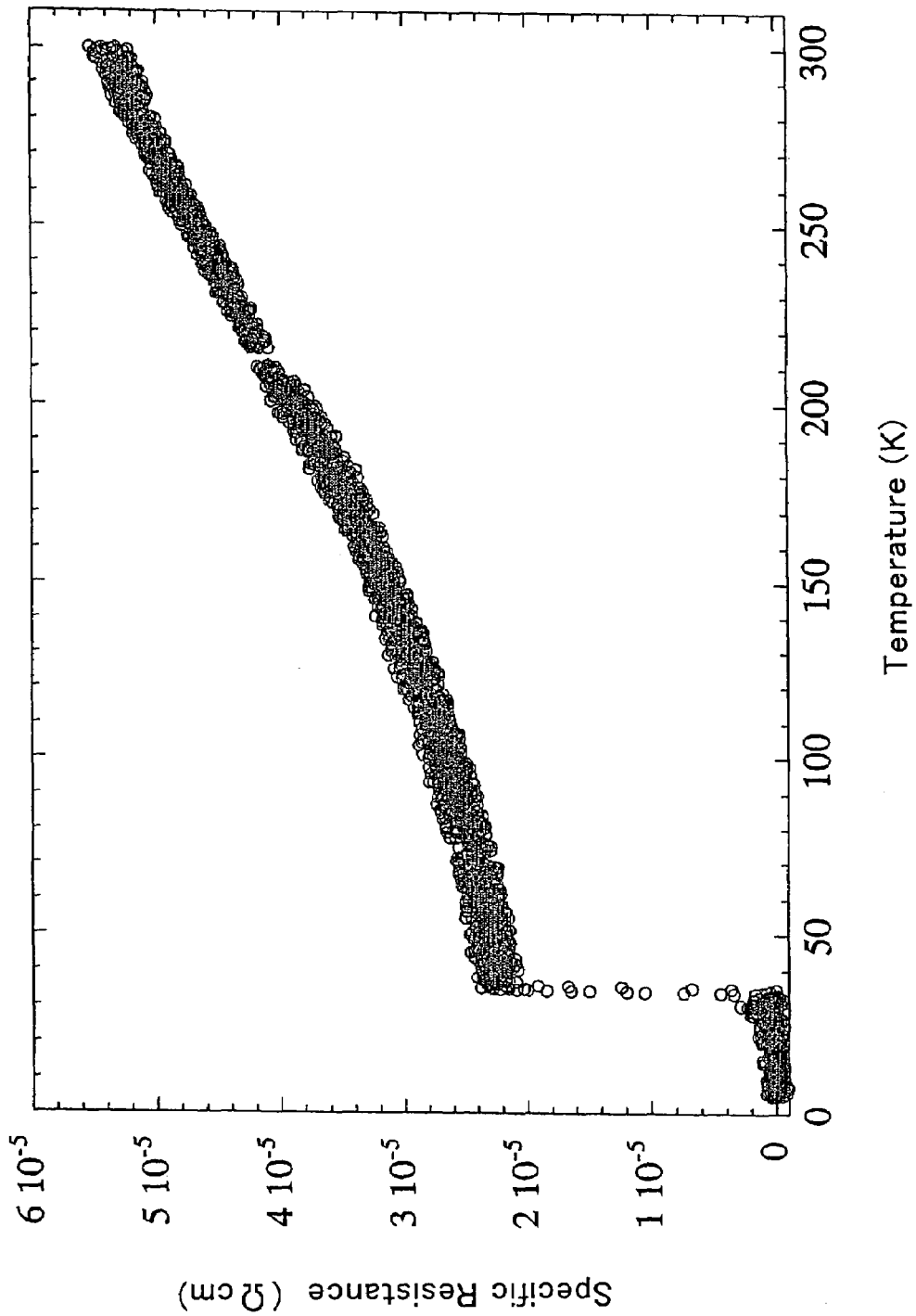
FIG. 2 is a diagram illustrating a result of measurements conducted to derive the temperature characteristics of the electrical resistivity of an alloy superconductor of a composition represented by composition formula: $Mg_1Be_xB_y$ (where 0<x<20 and 0<y<20) according to the present invention.

FIG. 2 is a diagram illustrating a result of measurements conducted to derive the temperature characteristics of the specific resistance (electrical resistivity of an alloy superconductor of a composition represented by composition formula: $Mg_1Be_xB_y$ (where 0<x<20 and 0<y<20) according to the present invention. The electrical resistance was measured according to the 4-probe method.

From FIG. 2, it is seen that the electrical resistance decreases with the temperature decreased, and sharply becomes zero at a temperature of 35 K, which indicates that the intermetallic compound has a superconducting transition temperature of 35 K. It is also seen from FIG. 2 that its specific resistance for normal conduction is extremely as low as $6 \times 10^{-5}$ ohm-cm over a temperature range from the superconducting transition temperature of 35 K to a room temperature.

Mention is next made of a result of measurements of the magnetic susceptibility of an alloy superconductor of a composition represented by composition formula: $Mg_1Be_xB_y$ (where 0<x<20 and 0<y<20) according to the present invention.

Figure 3:
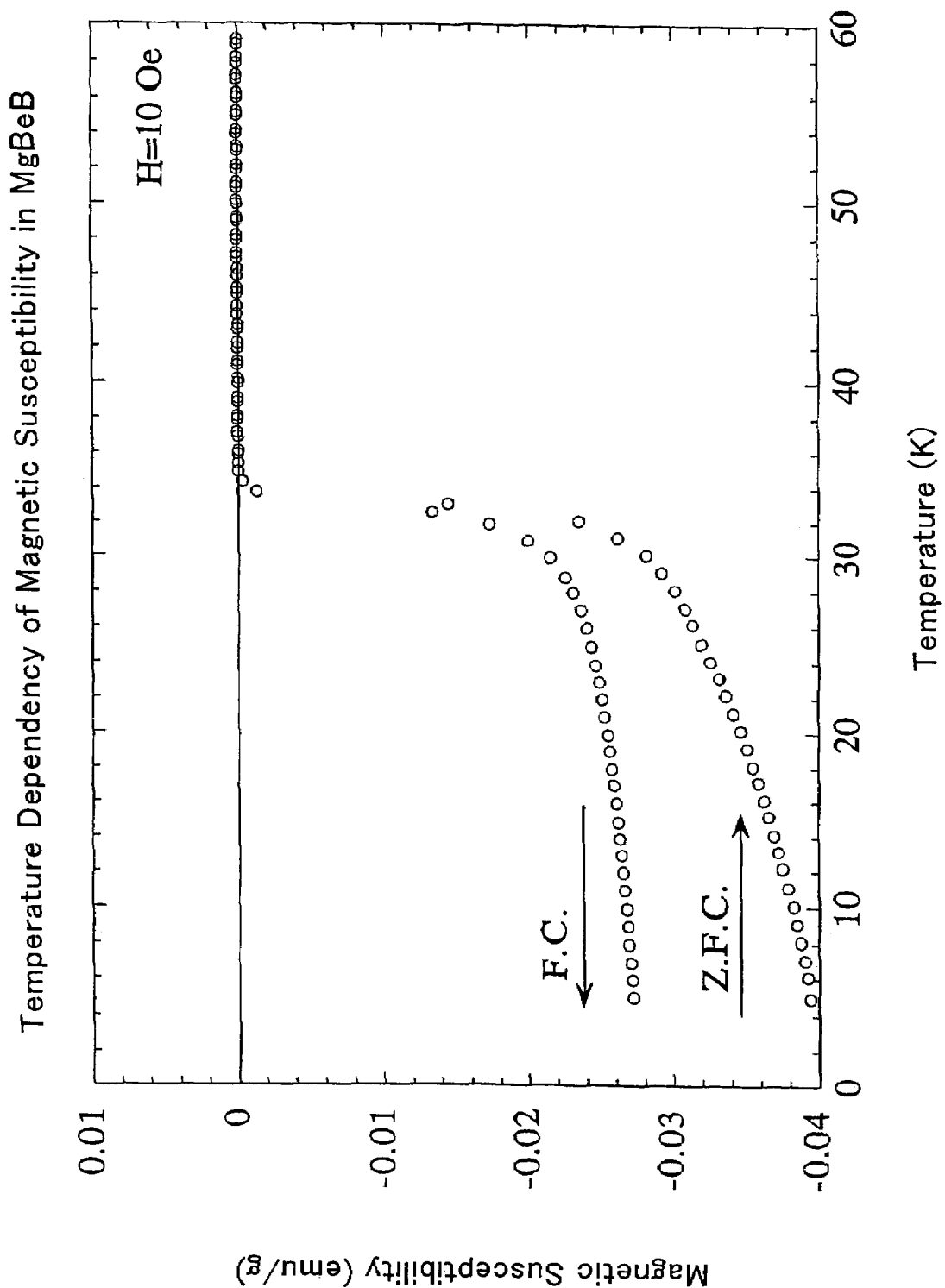
FIG. 3 is a diagram illustrating a result of measurements conducted to derive the temperature characteristics of the magnetic susceptibility of an alloy superconductor of a composition represented by composition formula: $Mg_1Be_xB_y$ (where 0<x<20 and 0<y<20) according to the present invention.

FIG. 3 is a diagram illustrating a result of measurements conducted to derive the temperature characteristics of the magnetic susceptibility of an alloy superconductor of a composition represented by composition formula: $Mg_1Be_xB_y$ (where 0<x<20 and 0<y<20) according to the present invention. The magnetic susceptibilities were measured using a DC susceptometer or DC susceptibility measurement apparatus (made by company Quantum Design, MPMS Series, Model MPMS-R2).

As is apparent from FIG. 3, exhibiting negative susceptibilities, namely diamagnetism, at temperatures lower than $T_c=35$ K it is seen that the alloy superconductor of a composition represented by composition formula: $Mg_1Be_xB_y$ (where 0<x<20 and 0<y<20) according to the present invention is a superconductor having a superconducting transition temperature of $T_c=35$ K.

If, in accordance with the method of manufacture according to the present invention, feedstock powders are mixed together to contain magnesium, beryllium and boron at a compositional ratio of Mg:Be:B=1:x:y where 0<x<20 and 0<y<20, then there comes out an alloy superconductor containing the intermetallic compound mentioned above. Here, the compositional ratio can be varied to meet with an application purpose. For example, making Mg larger in compositional proportion may produce a superconducting electric cable that especially excels in malleability and ductility.

As regards feedstock powders, use may be made of Mg powder or MgO powder for Mg, Be powder for Be and B or BN powder for B.

In making an alloy superconductor, several methods are available.

In a first method, a Mg powder, a Be powder and a B powder are mixed together in the agitating apparatus to form a powder mixture, which is then shaped into a pellet form, which in turn is placed in a HIP (hot isostatic pressing) apparatus (made by, e.g., company Kobe Seiko, high temperature, high pressure atmosphere furnace) charged with an inert gas and is heated therein under an inert gas pressure of 1 to 200 MPa at a temperature of 600 to 1100° C. for a period of several minutes or more. This method permits forming either superconductor with ease.

In a second method, a Mg powder, a Be powder and a B powder are mixed together in the agitating apparatus to form a powder mixture, which is then shaped into a pellet form, which in turn is placed in a cubic anvil pressing or like pressing apparatus and is heated therein under a pressure of 0.1 to 6 GPa at a temperature of 700 to 1400° C. (hot pressed) for a period of several minutes or more. This method permits forming either superconductor with ease. High pressure is required to facilitate joining grain boundaries together while high temperature is needed to grow superconducting phase.

It should be noted here that an alloy superconductor according to the present invention is not limited in form to a polycrystalline sintered body as above but may in form be a polycrystalline bulk body, large single crystal, or a thin film.

Using a conventional bulk body fabricating apparatus such as a forging or a superhigh-pressure pressing and heating synthetic apparatus permits an intermetallic-compound or alloy superconductor in the form of a polycrystalline bulk body to be made that is light in weight, high in hardness and excels in corrosion resistance.

Also, a large single-crystal alloy superconductor is obtainable by using a known single-crystal growth process such as recrystallization, simple lifting, floating zone melting or fluxing, with the use of a suitable crucible in a controlled atmosphere.

Further, a thin-film alloy superconductor is obtainable by chemical gas-phase vapor deposition using a gas phase source containing magnesium, beryllium and boron at compositional ratio of Mg:Be:B=1:x:y Where 0<x<20 and 0<y<20, or by sputtering with the use of a target material as a sputtering source containing magnesium, beryllium and boron at the above compositional ratio. Also, for the substrate on which to form a thin-film alloy superconductor, use may be a metal substrate formed of, e.g., Cu, or a ceramic substrate, and may be a composite substrate having a ceramic deposited on a metal substrate. Such substrates may selectively be used to meet with a particular use or application.

A superconducting alloy that excels in malleability and ductility is obtainable by making larger the proportion of Mg that excels in malleability and ductility, or by compounding upon addition of another metal or metals that excels in malleability and ductility. Such a superconducting alloy can be worked by rolling or extrusion into an ultra-thin multi-core superconducting cable, a thin superconducting wire, or a superconducting alloy wire or cable.

INDUSTRIAL APPLICABILITY

As can be appreciated from the foregoing description, the present invention provides an alloy superconductor which not only is high in superconducting transition temperature and excels in malleability and ductility, but also is low in specific resistance for normal conduction. Hence, it is not only useful for superconducting electronics such as a high performance Josephson device, a high frequency or electronic device, but also can highly advantageously be used to form superconducting electric cables to make them extremely less costly by eliminating the need to provide current bypassing metal wires therefor.

Further, using a method as described of making an alloy superconductor permits the alloy superconductor to be manufactured with an extremely high reproducibility, with ease, and at a reasonable cost.

What is claimed is:

1. An alloy superconductor consisting of $Mg_1Be_xB_y$ where 0<x<20 and 0<y<20.

2. An alloy superconductor as set forth in claim 1, characterized in that it has a superconducting transition temperature ($T_c$) of 35 K.

3. An alloy superconductor as set forth in claim 1, characterized in that it has a specific resistance not greater than $6 \times 10^{-5}$ ohm-cm at a temperature ranging from its superconducting transition temperature ($T_c$) of 35 K to a room temperature.

* * * * *